United States Patent [19]

Seki

[11] Patent Number: 4,770,737

[45] Date of Patent: Sep. 13, 1988

[54] FILM PEELING APPARATUS

[75] Inventor: Mitsuhiro Seki, Tokyo, Japan

[73] Assignee: Somar Corporation, Tokyo, Japan

[21] Appl. No.: 80,356

[22] Filed: Jul. 31, 1987

[51] Int. Cl.⁴ ............................................. B32B 31/18
[52] U.S. Cl. ..................................... 156/584; 30/123;
30/169; 156/344; 156/361
[58] Field of Search ................. 30/123, 169; 73/866.5;
156/64, 344, 361, 380.7, 584; 324/61 P, 61 R, 65
P, 65 R

[56] References Cited

U.S. PATENT DOCUMENTS

| | | | |
|---|---|---|---|
| 4,366,925 | 1/1983 | Fanene | 156/584 X |
| 4,421,608 | 12/1983 | McBride | 156/344 X |
| 4,631,110 | 12/1986 | Tsumura et al. | 156/584 |
| 4,685,982 | 8/1987 | Kucheck | 156/361 X |
| 4,685,991 | 8/1987 | Herrmann et al. | 156/344 |
| 4,724,032 | 2/1988 | Kay | 156/344 |

Primary Examiner—Robert A. Dawson
Attorney, Agent, or Firm—Sughrue, Mion, Zinn, Macpeak & Seas

[57] ABSTRACT

A film peeling apparatus for peeling off a film stuck onto a base by raising one end thereof comprises a projection-formed detecting member for detecting the end of said film stuck onto said base and an oscillating device for oscillating said projection-formed detecting member upon detection of the end of film by said detecting member to thereby raise the end of said film.

4 Claims, 9 Drawing Sheets

FILM PEELING APPARATUS

BACKGROUND OF THE INVENTION

1. Field of the Invention

This invention relates to a film peeling technique, and more particularly to a technique which can be employed effectively to peel off a protective film stuck to the surface of a substrate or panel.

2. Background of the Invention

In a printed circuit board for use in electronic equipment such as computers, a wiring having a prescribed pattern is formed from copper on one or both sides of an insulating board.

A printed circuit board of this type can be manufactured as follows: First, a laminate consisting of a photosensitive resin (photo-resist) layer and a translucent resin film (protective film) for protecting the photosensitive resin layer is thermally formed on the conductive layer on the insulated substrate under pressure. Thereafter, a circuit pattern film is laid over the laminate thus formed, and the photosensitive resin layer is exposed to light through the circuit pattern film and the translucent resin film for a predetermined period of time. After the translucent resin film is peeled off, the photosensitive resin layer thus exposed to light is subjected to developing to form an etching mask pattern. Thereafter, the unnecessary parts of the conductive layer are removed by etching, to obtain a printed circuit board having the predetermined circuit pattern.

In the above-described printed circuit board manufacturing method, in developing the photosensitive resin layer it is necessary to peel the translucent resin film off.

An object of the present invention is to obtain a film peeling apparatus which can certainly and instantly peel the thin film from a panel.

The above-described object and other objects of the invention and novel features of the invention will become more apparent when read the following description in conjunction with the accompanying drawings.

SUMMARY OF THE INVENTION

In order to achieve the above object, according to the present invention, a film peeling apparatus according to the present invention is intended for the purpose of peeling off a film stuck onto a base by raising one end thereof. The film peeling apparatus comprises a projection formed detecting member for detecting the end of the film stuck onto the base and an oscillating device for oscillating the projection-formed detecting member upon detection of the end of the film by the detecting member to thereby raise the end of the film.

The film peeling apparatus according to the present invention includes a fluid injection device for peeling the film off the base by sending a jet of fluid to the end of the film thus raised by the oscillating device.

In another aspect, according to the present invention, a film end raising apparatus, applicable to a film peeling apparatus, for raising up one end of a film stack onto a base comprises a projection-formed detecting member for detecting the end of said film stack onto said base and an oscillating device for oscillating said projection-formed detecting member upon detection of the end of the film by the detecting member to thereby raise the end of said film.

According to the present invention, the end of a film is searched out by the projected-form detecting member and the oscillating device operating on receiving a detection signal generated from the detection member is used to oscillate the projected detecting member located at the end of the film, so that the end of the film is raised certainly.

According to the present invention, moreover, a jet of fluid is supplied by the fluid injection device to the end of the thus surely raised film to ensure that the film is peeled off instantly.

DETAILED DESCRIPTION OF THE PREFERRED EMBODIMENT

Figure 1:
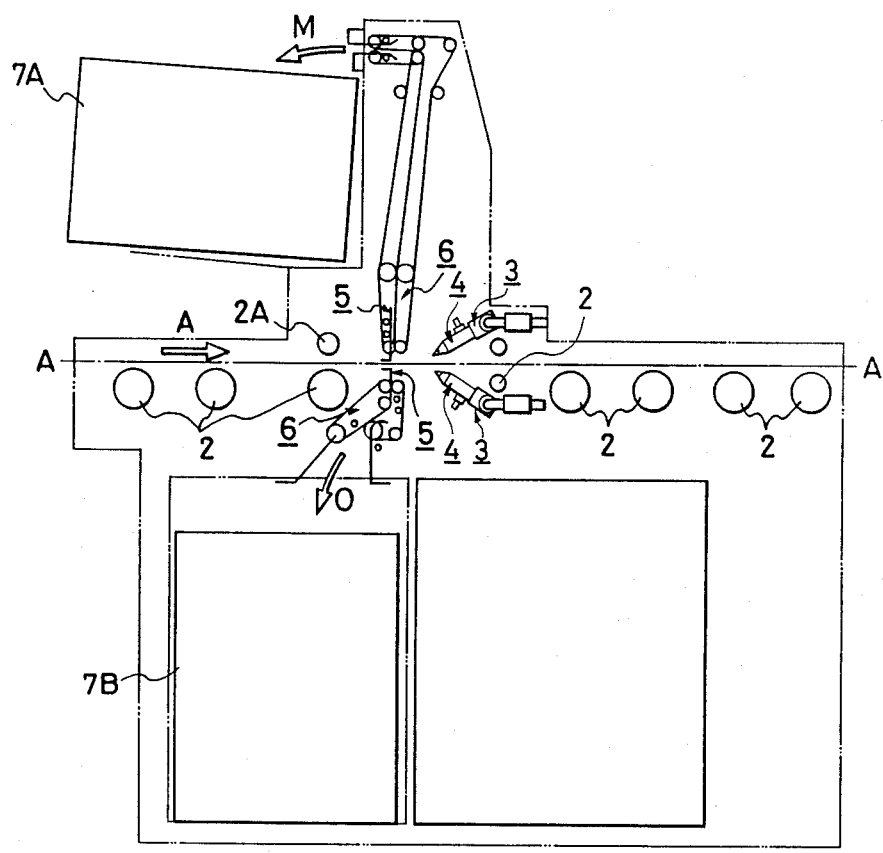
FIG. 1 is a side view showing a schematic construction of an embodiment of an apparatus for peeling a film from a board according to the present invention.

This invention will be described in detail with reference to an embodiment of an apparatus for peeling a protective film from a panel for a printed circuit board, to which the technical concept of the present invention is applied.

In the accompanying drawings, like parts are designated by like reference numerals or characters.

FIG. 1 is a schematic side view showing a construction of an apparatus for peeling off a protective film from a board for a printed circuit board, according to the present invention.

Figure 2:
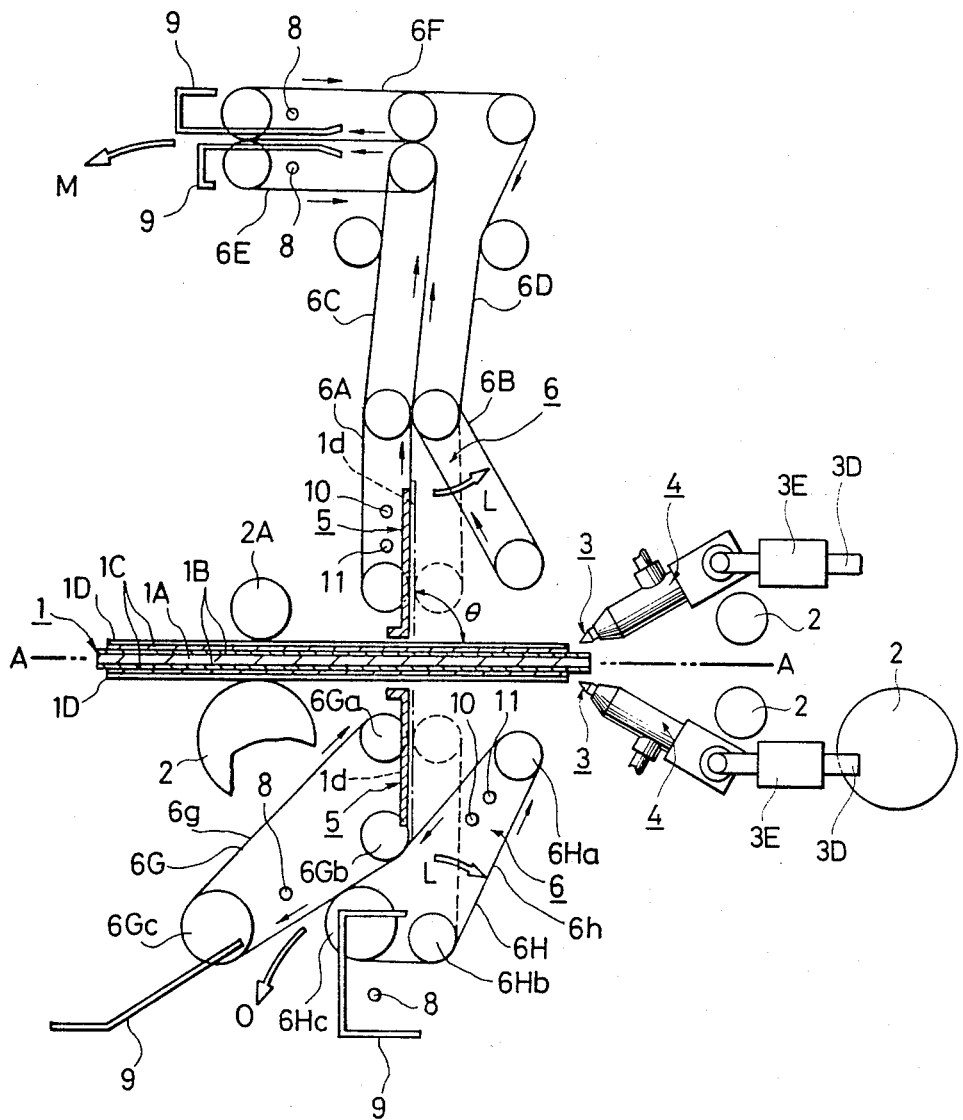
FIG. 2 is an enlarged side view showing the principal part of FIG. 1.

FIG. 2 is an enlarged side view of the principal portion of FIG. 1.

According to the present invention, the mechanism for conveying a board in the film peeling apparatus mainly comprises conveyance driving rollers 2 for conveying a board 1, as shown in FIGS. 1 and 2.

In the above-described conveyance mechanism, a film raising mechanism 3, a fluid injection mechanism 4, a peel angle setting plate (auxiliary peeling plate) 5 and a film delivery mechanism (film conveyance apparatus) 6 are arranged along the conveyance path A—A.

In the board 1, a conductive layer 1B of copper or the like is formed on one or both sides of an insulated substrate 1A, as shown in FIG. 2. A laminate consisting of a photosensitive resin layer 1C and a translucent resin film (or a protective film) 1D is thermally formed on the conductive layer 1B of the board 1 under pressure. The photosensitive resin layer 1C has been exposed to light in a predetermined circuit pattern.

The conveying rollers 2 are so designed as to convey the board 1 in the direction of the arrow A, as shown in FIG. 1.

Figure 3:
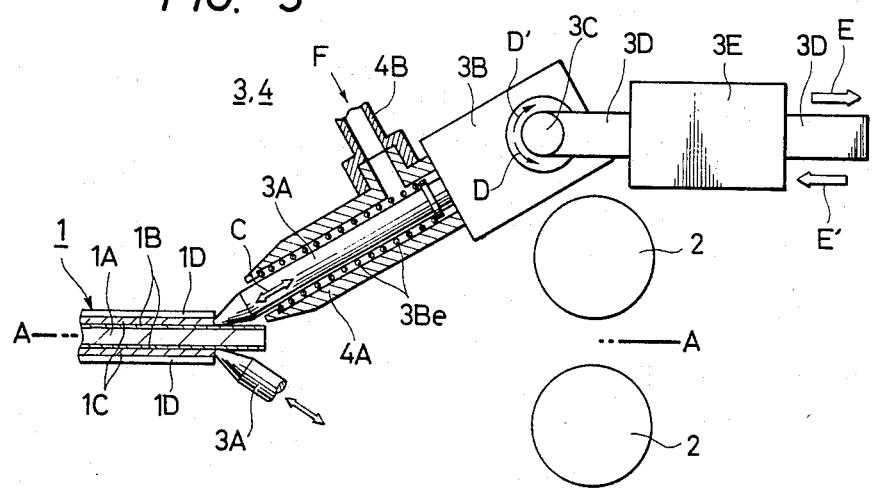
FIG. 3 shows construction of the film raising device and the fluid injection device shown in FIGS. 1 and 2, concretely.

The film raising device 3 and the fluid injection device 4 are constructed as shown in FIG. 3 where the construction of them are concretely shown.

The film raising device 3 mainly comprises a project projection-formed detecting member 3A and an oscillating device 3B.

The projection-formed detecting members 3A are respectively installed on both sides of the board 1, each performing as a contact element of a detecting device for detecting the end of the laminate of the board 1 conveyed by a conveyance mechanism. When a capacitive detecting device is employed as the detecting device, the end of the laminate can be detected, by detecting the capacitance of the board 1 in both portions where the laminate is provided and where the laminate is not provided (where the conductive layer 1B is exposed). Moreover, use can be made of a resistive detecting device for detecting the end of the laminate by detecting the resistance on each of the translucent resin film 1D and conductive layer 1B, and a reflective detecting device for detecting the end of the laminate by detecting the reflection factor on the surface of each of the translucent resin film 1D and the conductive layer 1B. For example, the projected-formed detecting member 3A is made of a conductive material such as copper, or is made of insulating material on the surface of which a conductive material is laid. As shown in FIG. 5, the projection-formed detecting member 3A is connected via a lead L to the capacitive (or resistive) detecting device. The tip of the projected-formed detecting member 3A has a sharp conical shape to ensure that the end of the laminate is pressed to be deformed as shown in FIG. 4.

The other end of the detecting member 3A which is not in contact with the board 1 is fixed to the oscillating device 3B. The detecting member 3A is fixed via an insulating member 3Ba to the oscillating device 3B. The oscillating device 3B comprises a L-shaped moving member 3Bc rotating on a rotary shaft 3Bb in direction of arrow B, an electromagnet 3Bd, and a spring 3Be. The oscillating device 3B causes the moving member 3Bc to reciprocate in direction of arrow B, by means of the intermittent actuation of the electromagnet 3Bd and the resilient force of the spring 3Be, so that the projected-formed detecting member 3A is oscillated in direction of arrow C. More specifically when the end of the laminate is detected by the detecting member 3A, the capacitive detecting device, for instance, outputs a detection signal. With receiving the signal, the oscillating device 3B actuates the electromagnet 3Bd and oscillates the projected detecting member 3A.

Figure 4:
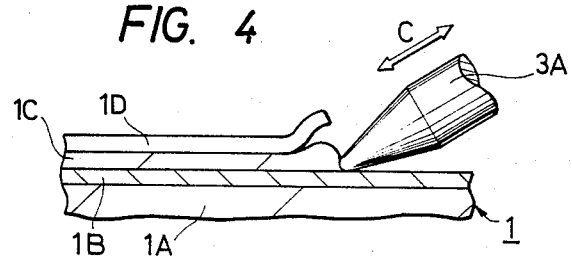
FIG. 4 is an enlarged sectional view of the principal part of FIG. 3.
Figure 5:
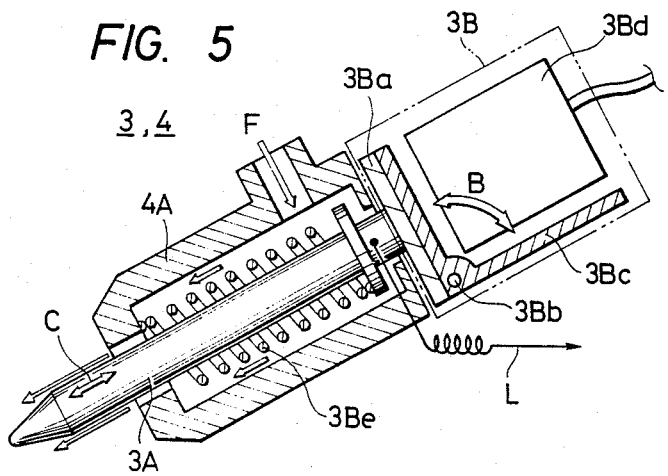
FIG. 5 is a sectional view showing in greater detail the construction of the film raising device and the fluid injection device of FIG. 3.

The projection-formed detecting member 3A, which is oscillated at the end of the laminate by the oscillating device 3B, is, as shown in FIG. 4, capable of raising part of the translucent resin film 1D from the photosensitive resin layer 1C and producing a gap in the interface therebetween. Since the photosensitive resin layer 1C is prepared from material softer than that of the translucent resin film 1D, the plastic deformation of the photosensitive resin layer 1C resulting from the pressure applied by the oscillation of the projected detecting member 3A serves to form the gap. In other words, the formation of the gap is attributed to the difference in plastic deformation point between the translucent resin film 1D and the photosensitive resin layer 1C.

As shown in FIG. 3, the film raising device 3 is supported to a moving member 3D via a rotary shaft 3C which is fitted to the oscillating device 3B rotatably in directions of arrows D and D'. The film raising device 3 is made rotatable, by a driving source such as an air cylinder, a hydraulic cylinder and a solenoid (not shown), in direction of arrow D with respect to the moving member 3D. The moving member 3D supporting the film raising device 3 is made movable, by a linear head 3E, in directions of arrow E and E' which are the same with and opposite to the base conveying direction, respectively, of the apparatus body. Moreover, the moving member 3D may be driven by an air cylinder, hydraulic cylinder or solenoid in place of the linear head.

Thus constructed one or a plurality of film raising devices 3 are arranged in a direction across the base conveying direction (in the widthwise direction of the board 1), on both surface sides of the board 1. In consideration of errors produced when the insulating base 1A and the laminates are heat-bonded with each other, the film raising device 3 should preferably be placed in at least three places in the direction across the base conveying direction.

Furthermore, one or a plurality of film raising devices 3 may be installed respectively on each surface side of the board 1 in such a manner that they are arranged in the same direction as the base conveying direction or at the corners of the board 1.

The fluid injection device 4 comprises, as shown in FIGS. 3 and 5, a fluid injection nozzle 4A and a fluid supply member 4B which are integrated with the film raising device 3.

The fluid injection nozzle 4A is used to inject fluid F to which the pressure is applied by the fluid supply member 4B, the fluid F including a gas such as air and inactive gas, and a liquid such as water. The fluid injection nozzle 4A is arranged so as to cover the projected-form detecting member 3A, that is, to have the detecting member 3A oscillated by the oscillating device 3B within the fluid injection nozzle 4A. The fluid F jetted out of the fluid injection nozzle 4A is directly sent to the end of the laminate raised by the projected detecting membe 3A of the film raising device 3 with the gap produced thereat. More specifically, the fluid injection nozzle 4A having the projection-formed detecting member 3A therein is capable of accurately guiding the fluid injection outlet to the end of the laminate thus raised and setting the injection outlet considerably close thereto, to ensure that the fluid F is sent to the end of the raised laminate.

The fluid injection nozzle 4A is made of insulating material such as hard plastic so that the detecting member 3A is prevented from malfunctioning in detecting the position of the end of the laminate even if the detecting member 3A comes into contact with the injection nozzle 4A. Moreover, the fluid injection nozzle 4A may be formed such that its portion which is apt to contact the detecting member 3A is formed of insulating material.

The fluid injection device 4 thus constructed moves as the film raising device 3 moves when the rotary shaft 3C and linear head 3E are operated.

Referring to FIGS. 1 through 5 and FIGS. 6 through 11 showing respective operating states of the film raising device and fluid injection device, the operation of the film raising device 3 and the fluid injection device 4 will be described below.

First, the board 1 is conveyed by the conveying rollers 2.

Figure 6:
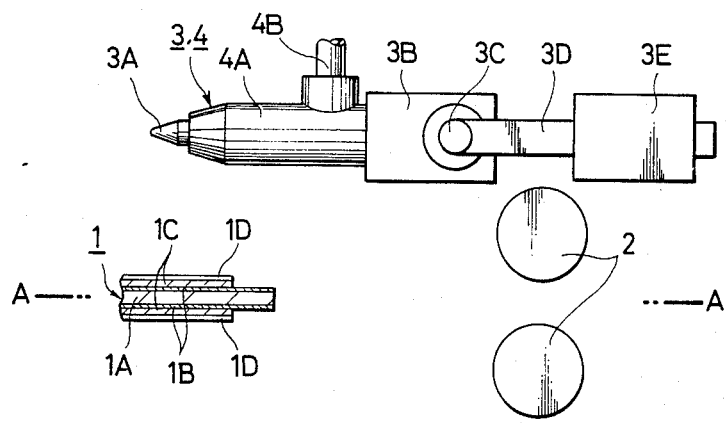
FIGS. 6 through 11 show several operating states of the film raising device and the fluid injection device of FIG. 2.

Subsequently, as shown in FIG. 6, the conveyance of the board 1 is stopped once when the front ends of the laminates on the board 1 pass the position where the film raising devices 3 and the fluid injection devices 4 are set. The film raising devices 3 and the fluid injection devices 4 have been set in such a state that they are apart from the board 1 conveyed so that they are prevented from making contact with the board 1, as shown in FIG. 6. For stopping the conveyance of the board 1, a transmissive or reflective optical sensor for detecting the front end of the board is employed. A pinch roller 2A shown in FIG. 2 is pressed against the board 1 thus stopped, and the board 1 is held between the pinch roller 2A and the conveyance driving roller 2 to be fixed.

Figure 7:
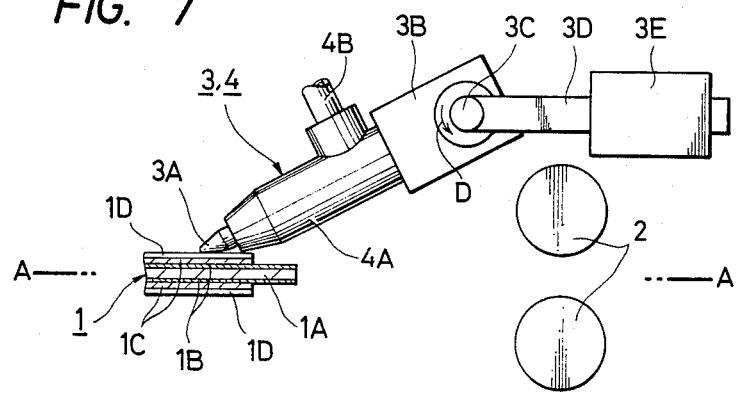

As shown in FIG. 7, the film raising device 3 and the fluid injection device 4 are so driven by the rotary shaft 3C as to turn in direction of arrow D and the projection-formed detecting member 3A is caused to contact the surface of the laminate, i.e., the translucent resin film 1D.

Figure 8:
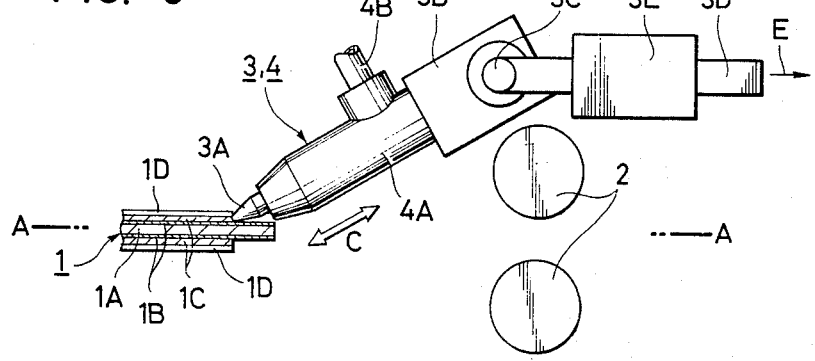
Figure 9:
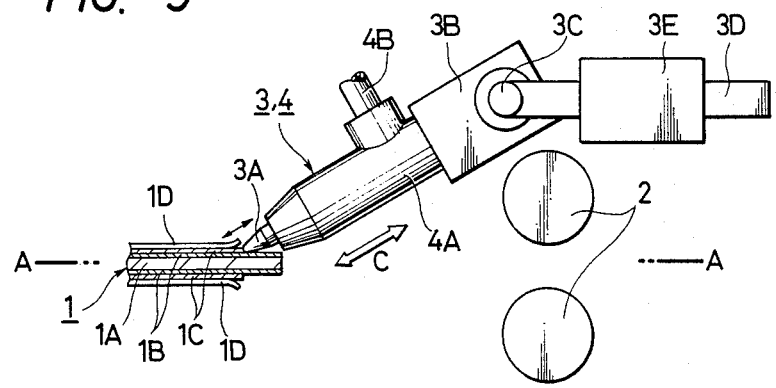

Subsequently, as shown in FIG. 8, the moving member 3D is moved by the linear head in direction of arrow E (which is the same direction as the base conveying direction) while the projected-form detecting member 3A is kept contacting the surface of the translucent resin film 1D. When the detecting member 3A is separated from the surface of the translucent resin film 1D and reaches the surface of the conductive layer 1B, i.e., when the detecting member 3A is positioned at the end of the laminate, the capacitance detected by a capacitive detecting device (not shown) is changed, so that the position of the end of the laminate is detected by the capacitive detecting device. The capacitive detecting device outputs a detection signal, and with the signal, the operation of the linear head 3E is stopped. As described above, the end of the laminate is detected when the capacitance of the board 1 changes. While the projected-form detecting member 3A is located at the end of the laminate, the oscillating device 3B starts oscillating the detecting member 3A in direction of arrow C, on receiving the detection signal from the capacitive detecting device. As the detecting member 3A oscillates, part of the translucent resin film 1D is, as shown in FIG. 9, raised from the photosensitive resin layer 1C at the end of the laminate.

Figure 10:
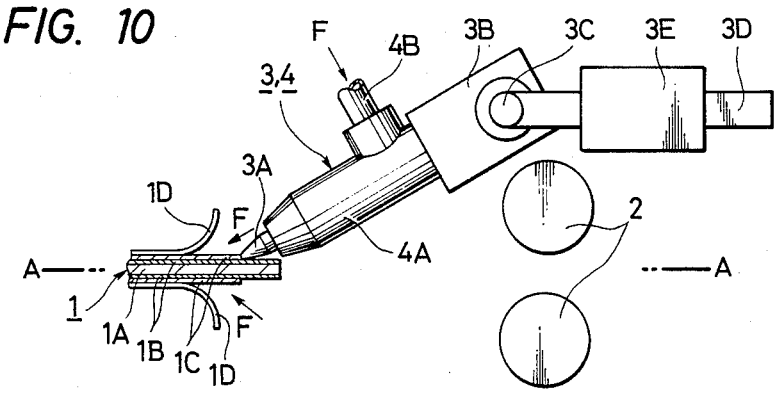

Then a jet of pressurized fluid F is sent from the fluid injection nozzle 4A to the portion of the end of the laminate thus raised, i.e., to the gap between the photosensitive resin layer 1C and the translucent resin film 1D and, as shown in FIG. 10, the operation of peeling the translucent resin film 1D off is started.

Figure 11:
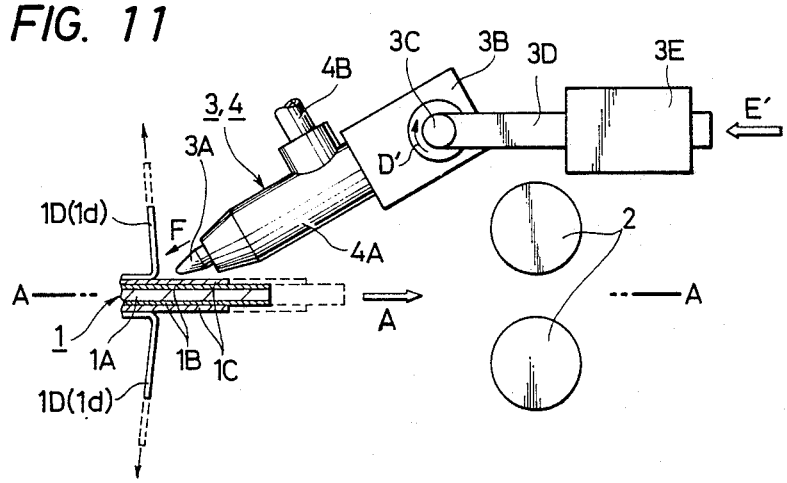

As shown in FIG. 11, the rotary shaft thus turned in direction of arrow D' moves and makes the tip of the projection-formed detecting member 3A separate from the photosensitive resin layer 1C, whereas the fluid F is continuously sent to the peel position to peel off the translucent resin film 1D (1d) continuously. The injection of a jet of fluid F to the peel position is continuously conducted with moving the moving member 3D in direction of arrow E' using the linear head 3E, or with carrying the board 1 in a direction of arrow A using the conveyance driving rollers 2. Or the injection of the fluid is conducted, with moving both the moving member 3D and the board 1.

As set forth above, there are provided the projected-form detecting members 3A for detecting the ends of the laminates stuck onto the board 1 and the oscillating devices 3B for oscillating the detecting members 3A upon the detection of the end of the laminates so as to raise the ends of the laminate. Accordingly, the end of the laminates is accurately detected by the detecting members 3A and, on receiving the detection signal generated from the detecting-member, the oscillating devices 3B start oscillating the detecting members 3A which have been precisely positioned at the ends of the laminates to ensure that parts of the translucent resin films 1D are raised up from the photosensitive resin layers 1C.

Moreover, the fluid injection devices 4 are provided for injecting jets of pressurized fluid F to the ends of the laminates thus raised by the oscillation of the projected detecting members 3A, so that the translucent resin films 1D are peeled by the pressurized fluid F off from the photosensitive resin layers 1C surely and instantly.

The projected form detecting member 3A operates both as a contact element for detecting the end of the laminate and as a projection member for raising the end of the laminate whereby the space required for the film raising device 3 to surely raise the end of the laminate can be reduced, to make the film peeling apparatus compact.

In addition, since the projected-form detecting member 3A is so arranged as to be oscillated inside the fluid injection nozzle 4A of the fluid injection device 4 by the oscillating device 3B, it becomes possible to reduce the space required for the film raising device and the fluid injection device, so that the size of the film peeling apparatus can be made compact.

Further, the projected-form detecting member 3A arranged to be oscillated in the fluid injection nozzle 4A by the oscillating device 3B makes it possible to accurately guide the outlet of the fluid injection nozzle 4A to the position sufficiently close to the end of the laminate raised by the detecting member 3A. Consequently, the peel effect is improved to assure that the translucent resin films 1D are efficiently peeled off from the photosensitive resin layers 1C. In the film raising devices 3 and the fluid injection devices 4 thus constructed, moreover, the outlets of the fluid injection nozzles 4A can be guided accurately substantially close to the end of the laminates, irrespective of the thickness of the board 1.

The end of the laminate can be raised by the projected-form detecting member 3A which is simple in construction.

Since the projected-form detecting members 3A are provided in the board carrying passage, it makes possible to perform the operation of automatically peeling off the ends of the laminates.

Figure 12:
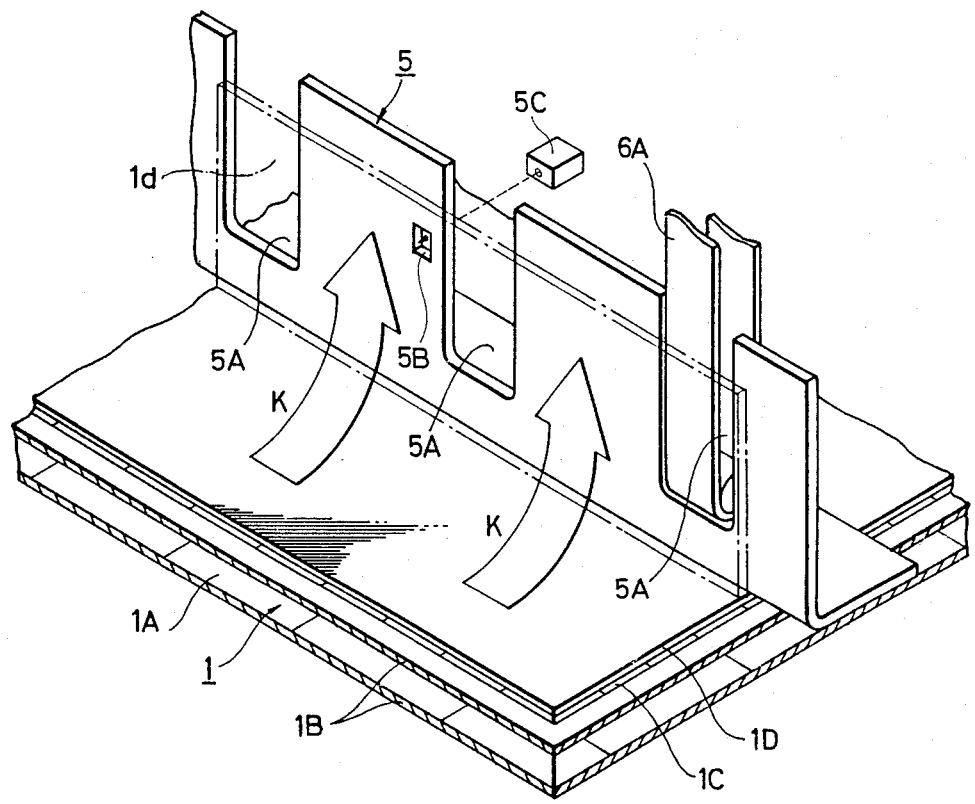
FIG. 12 is a perspective view of the principal part of the peel angle setting plate of FIGS. 1 and 2.

As shown in FIGS. 1, 2 and 12, the front end 1d of the translucent resin film in the conveyance direction thereof peeled off by the fluid injection mechanism 4 is stuck to the peel angle setting plate (auxiliary peeling plate) 5 by the fluid pressure, and the peel position and the peel angle $\theta$ for peel direction is set. The translucent resin film 1d is shown by one-dot-and-dash line of FIGS. 2 and 12.

A peel angle $\theta$ is formed between the translucent resin film 1D stuck onto the board 1 and the direction in which the translucent resin film 1d thus raised up from the board 1 is discharged. A peel angle setting plate 5 is arranged substantially perpendicular to the board 1. The peel angle at the peel position should be preferably set obtuse with respect to the carrying direction of the board 1, i.e. the direction of arrow A. In the case of the peel angle setting plate 5 having the peel angle θ of about a right angle, the peel angle of the peeling direction of the translucent resin film 1d is about 90 degrees. In this case, the carrying speed of the board 1 is made slightly higher than the discharge speed of the translucent resin film 1d, so that the peel angle at the peel position is made substantially obtuse.

The peel angle setting plate 5 is installed such that the front end of the peel angle setting plate 5 on the peeling side at the peel position is apart from the translucent resin film 1D stuck to the board 1 and such that the setting plate may not brush with the resin film 1D to prevent the photosensitive resin layer 1C from being damaged or broken down. Furthermore, the peel angle setting plate 5 is movably arranged so that the front end of the peel angle setting plate 5 sticks tightly to the translucent resin film 1D during the time the fluid is being injected, for preventing reduction of the peel effect. Since the peel angle setting plate 5 is movable, an accurate peeling position can ensurely obtained in corresponding to a thickness of the board 1, even if the boards 1 different in its thickness from one another are conveyed. The peel angle setting plate 5 may be moved or transferred by an air or hydraulic cylinder. Moreover, the front end of the peel angle setting plate 5 is in a circular arc form with its curvature radius being small, that is, its curvature radius being less than 3 mm.

Moreover, the peel angle setting plate 5 has its front end located closer to the board 1 conveyed than the thin film delivery mechanism 6. The peel angle setting plate 5 extends in the peel direction (film delivery direction) with a predetermined length. The peel angle setting plate 5 extends in a crosswise direction of the peeled-film crossing the film peeling direction with its length being enough to cover the width of the conveyance path of the board 1 or the fluid injection width. In other words, the peel angle setting plate 5, as the direction of the fluid flown is shown by an arrow K in FIG. 12, is capable of increasing the peeling effects, by preventing the fluid from being blown to the rear side of the peel angle setting plate 5 and is capable of increasing the adhesion of the peeled translucent resin film 1d to the peel angle setting plate 5.

The peel angle setting plate 5 is fixed to the apparatus body at its predetermined position.

The peel angle setting plate 5 is able to stabilize the peel position and apply uniform peeling force to the translucent resin film 1D. Accordingly, the peel angle setting plate 5 prevents the peel position from shifting when the translucent resin film 1D is being peeled off and prevents peel stress from distorting and the photosensitive resin layer 1C from being damaged or broken.

The peeling angle setting plate 5 is provided with a through-hole 5B at the position to which the translucent resin film 1d peeled is stuck. The through-hole 5B is used for detecting the film peeled. The through-hole 5B is arranged so that the detection light for an optical sensor 5C can pass through the hole 5B. As a result, it is made clear whether or not the translucent resin film 1d peeled is surely present on the peeling angle setting plate 5. In the case where the presence of the translucent resin film is unconfirmed through the aforesaid detection and there is a possiblity that the film may not have been peeled properly, the base is discharged from the conveyance passage, after the peeling is performed.

Figure 13:
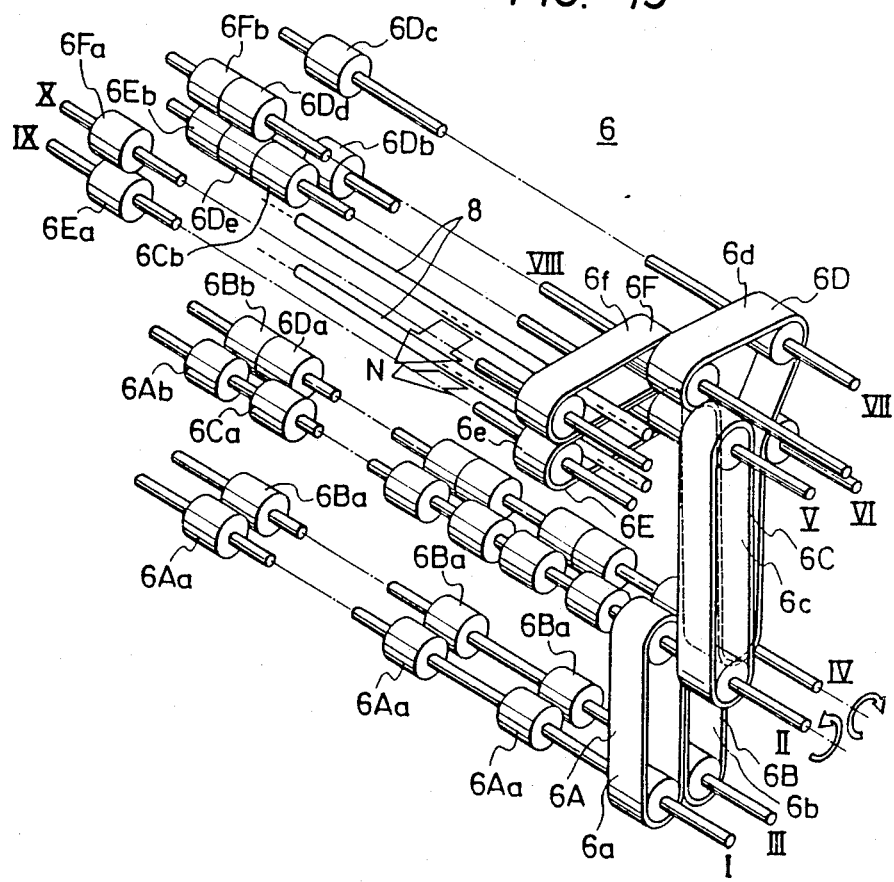
FIG. 13 is an enlarged exploded perspective view of the film conveyance portion of FIGS. 1 and 2.

The translucent resin film 1d stuck to the peel angle setting plate 5 by the fluid injection mechanism 4 is, as shown in FIGS. 1, 2 and 13, carried out by the film carrying out mechanism (thin film conveyance mechanism) 6 while the thin film is being peeled off.

The thin film conveyance mechanism 6 comprises an upper conveyor belt mechanism and a lower conveyor belt mechanism installed on both sides of the board 1, respectively.

The upper conveyor belt mechanism consists of, as shown in FIG. 13 in detail, fixed conveyor belts 6A, 6C, 6D, 6E, 6F and a moving conveyor belts 6B.

The fixed conveyor belt 6A consists of a roller 6Aa supported by a driven shaft I, a roller 6Ab supported by a driving shaft II and a belt 6a wound on the rollers 6Aa and 6Ab.

The moving conveyor belt 6B consists of a roller 6Ba supported by a driven shaft III, a roller 6Bb supported by a driving shaft IV and a belt 6b wound on the rollers 6Ba and 6Bb. The moving conveyor belt 6B is rotated on the driving shaft IV in the direction of an arrow L as shown in FIG. 2. The moving conveyor belt 6B facilitates the adhesion of the peeled translucent resin film 1d to the peel angle setting plate 5 and is capable of carrying the translucent resin film 1d by sandwiching it between the moving conveyor belt 6B and the fixed conveyor belt 6A. The operation of sandwiching the translucent resin film 1d between the fixed and moving conveyor belts 6A and 6B is conducted through a cut 5A provided in the peel angle setting plate 5, as shown in FIG. 12.

The fixed conveyor belt 6C consists of a roller 6Ca supported by the driving shaft II, a roller 6Cb supported by a driven shaft V and a belt 6c wound on rollers 6Ca, 6Cb.

The fixed conveyor belt 6D consists of a roller 6Da supported by the driven shaft IV, a roller 6Db supported by the driven shaft VI, a roller 6Dc supported by a driven shaft VII, a roller 6Dd supported by a driven shaft VIII, a roller 6De supported by the driven shaft V and a belt 6d wound on rollers 6Da to 6De.

Figure 14:
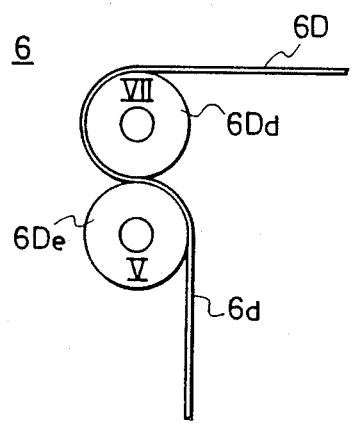
FIGS. 14 and 15 are sectional views of the principal part of the film conveyance portion of FIG. 13.

The fixed conveyor belts 6C and 6D are so arranged as to further carry out the translucent resin film 1d carried out by the fixed and moving conveyor belts 6A and 6B. The roller 6De of the fixed conveyor belt 6D is intended to comply with the change of the conveyance direction at a large angle when the translucent resin film 1d is carried out from the fixed conveyor belts 6C and 6D to the fixed conveyor belts 6E and 6F, as shown in FIG. 14. In other words, the curvature radii of the belts 6c and 6d, on their surfaces contacting with the translucent resin film 1d at the position where the conveyance direction is changed, are made equal to each other by the roller 6De. Accordingly, the translucent resin film 1d is prevented from producing winkles and trouble such as a jam during conveyance.

Figure 15:
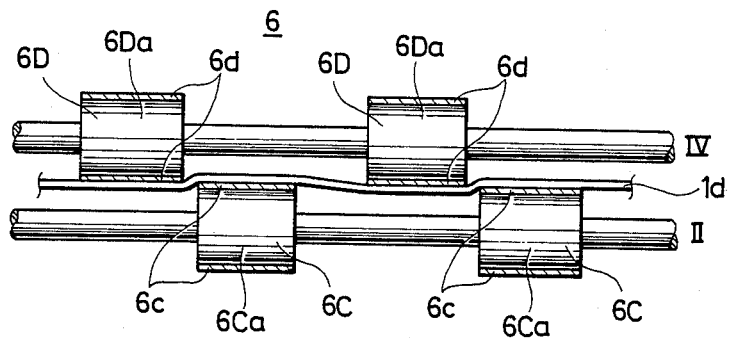

As shown in FIG. 15 (a partial sectional view), a plurality of fixed conveyor belts 6C (or 6D) brought in contact with one side of the translucent resin film 1d are installed at fixed intervals in the crosswise direction of the translucent resin film 1d crossing the conveyance direction. The fixed conveyor belts 6D (or 6C) brought in contact with the other side of the translucent resin film 1d is installed in between the plurality of the fixed conveyor belts 6C (or 6D). In other words, the fixed conveyor belts 6C and 6D are arranged in a staggered manner in the crosswise direction of the translucent resin film 1d so that surfaces of the belts 6c and 6d (the contacting faces with the translucent resin film 1d) are in a single plane, or otherwise the belts 6C, 6D bite into each other such that a plane formed by the surfaces of the belts 6c crosses the belts 6D and a plane formed by the surfaces of the belts 6d crosses the belts 6C.

Since the fixed conveyor belts 6C and 6D are thus arranged in a staggered manner, the translucent resin film 1d being carried out is supplied with tension in the crosswise direction thereof, so that the translucent resin film 1d can be sandwitched securely uniformly between the fixed conveyor belts 6C and 6D.

Moreover, the translucent resin film 1d sandwiched in between the fixed conveyo belts 6C and 6D is carried in such a form as to wrap the surfaces and sides of the belts 6c and 6d, respectively. In consequence, the rollers 6Ca, 6Cb, 6Da to 6De are not allowed to shift from the belts 6c and 6d in the axial direction of the rollers, respectively. The sandwiching force applied to the translucent resin film 1d during conveyance is thus uniformalized, whereas wrinkles and thus jamming are prevented from occurring. Since the thin film conveyance mechanism according to the present invention has a container 7A for containing the peeled upper translucent resin films conveyed by the upper conveyance belt mechanism and discharged, as will be described later, and the conveyance path of the upper conveyance belt mechanism is longer than the lower conveyance belt mechanism, it is effective to form the fixed conveyor belts 6C and 6D in such a manner as described above.

The fixed conveyor belt 6E consists of a roller 6Ea supported by a driven shaft IX, a roller 6Eb supported by the driven shaft V and a belt 6e wound on the rollers 6Ea and 6Eb.

The fixed conveyor belt 6F consists of a roller 6Fa supported by a driven shaft X, a roller 6Fb supported by the driven shaft VIII and a belt 6f wound by the rollers 6Fa and 6Fb.

As shown in FIGS. 1 and 2, the fixed conveyor belts 6E and 6F are so arranged as to discharge the translucent resin film 1d carried by the fixed conveyor belts 6C and 6D frpm the apparatus body in the direction of an arrow M. The translucent resin film 1d discharged from the apparatus body is contained in the container 7A for containing the peeled upper translucent resin films discharged, as shown in FIG. 1. The container 7A for containing the peeled upper translucent resin films discharged is detachably mounted on the apparatus body, in its upper portion.

The lower conveyor belt mechanism comprises a fixed conveyor belt 6G and a moving conveyor belt 6H as shown in FIG. 2.

The fixed conveyor belt 6G consists of rollers 6Ga and 6Gc supported by different driven shafts (not shown), a roller 6Gb supported by a driven shaft (not shown) and a belt 6g wound on the rollers 6Ga to 6Gc.

The moving conveyor belt 6H consists of rollers 6Ha and 6Hc supported by different driven shafts (now shown), a roller 6Hb supported by a driving shaft (not shown) and a belt 6h wound on the rollers 6Ha to 6Hc.

The fixed conveyor belts 6G and the moving conveyor belt 6H carry a translucent resin film 1d peeled from the another side of the board, with peeling the film 1d whose peel position and angle are set by the peel angle setting plate 5 as in the case of the above-described upper conveyor belt mechanism. The conveyor belts 6G and 6H discharge the translucent resin film 1d from the apparatus body in the direction of an arrow O. The translucent resin film 1d discharged from the apparatus body is contained in a container 7B for containing the discharged lower translucent resin films as shown in FIG. 1. The container 7B for containing the discharged lower translucent resin films is detachably mounted on the apparatus body. Moreover, the container 7A for containing the discharged upper translucent resin films is installed above the container 7B so that area occupied by the containers 7A and 7B is reduced to thereby make the apparatus body compact.

As shown in FIGS. 2 and 13, a fluid spray mechanism 8 for sending a jet of fluid to the translucent resin film 1d being discharged in the direction of an arrow N is installed close to each of the conveyance paths on the discharge sides of the fixed conveyor belts 6E, 6F, and 6G and the moving conveyor belt 6H. The angle $\theta_1$ of the direction in which the fluid is sent out with respect to the translucent resin film 1d being discharged is acute ($0 \leq \theta_1 \leq 90$), to ensure that the translucent resin film 1d is led to the discharge direction by the jet of fluid. The fluid spray mechanism 8 comprises a pipe with outlets from which the fluid is jetted out, the outlets being provided between the respective two conveyor belts 6E and 6E (6F and 6F, 6G and 6G and 6H and 6H) disposed adjacent to each other in the crosswise direction of the film 1d being carried crossing the conveyance direction. As the fluid, gas such as pressurized air or inert gas or the like and liquid such as water or the like may be used. A static eliminator (not shown) for reducing electrification of the translucent resin film 1d is installed close to the fluid sprayer 8.

By thus installing the fluid spray mechanism 8 on the discharge side of each of the fixed conveyor belts 6E, 6F, 6G and moving conveyor belt 6H, the translucent resin film 1d being discharged is prevented from being wound on the fixed conveyor belts 6E, 6F and 6G or moving conveyor belt 6H, and the translucent resin film 1d can be led by the fluid in the direction of the arrow M or O. As a result, the translucent resin film 1d may be discharged into the container 7A or 7B for containing the discharged upper or lower translucent resin film 1d efficiently.

Moreover, a roll-in preventing member 9 is installed close to the conveyance path on the discharge side, between the respective two conveyor belts 6E and 6E (6F and 6F, 6G and 6G and 6H and 6H) disposed adjacent to each other in the crosswise direction of the film 1d conveyed crossing the conveyance direction. Accordingly, the translucent resin film 1d is prevented from being wound on the fixed conveyor belts 6E, 6F, 6G or moving conveyor belt 6H.

As shown in FIG. 2, static eliminators 10 and ion dispersion devices 11 are installed close to the fixed conveyor belt 6A and the moving conveyor belt 6H, respectively. The static eliminator 10 is used to discharge ions in order that the static electrification of the translucent resin film 1d to be occurred while the film 1d is peeled off or carried can be reduced. The ion dispersion device 11 disperses the ions discharged by the static eliminator 10, in order to efficiently reduce the static electrification of the film 1d. The device 11 disperses ions, using pressurized fluid such as air, for example.

Figure 16:
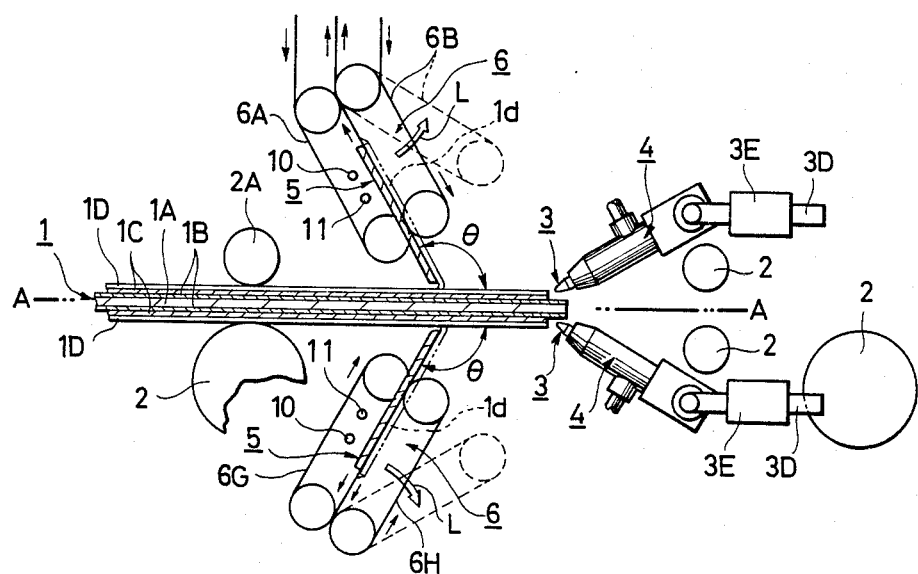
FIG. 16 is a side view of the principal part of the schematic construction of another embodiment of a film peeling apparatus of the present invention.
Figure 17:
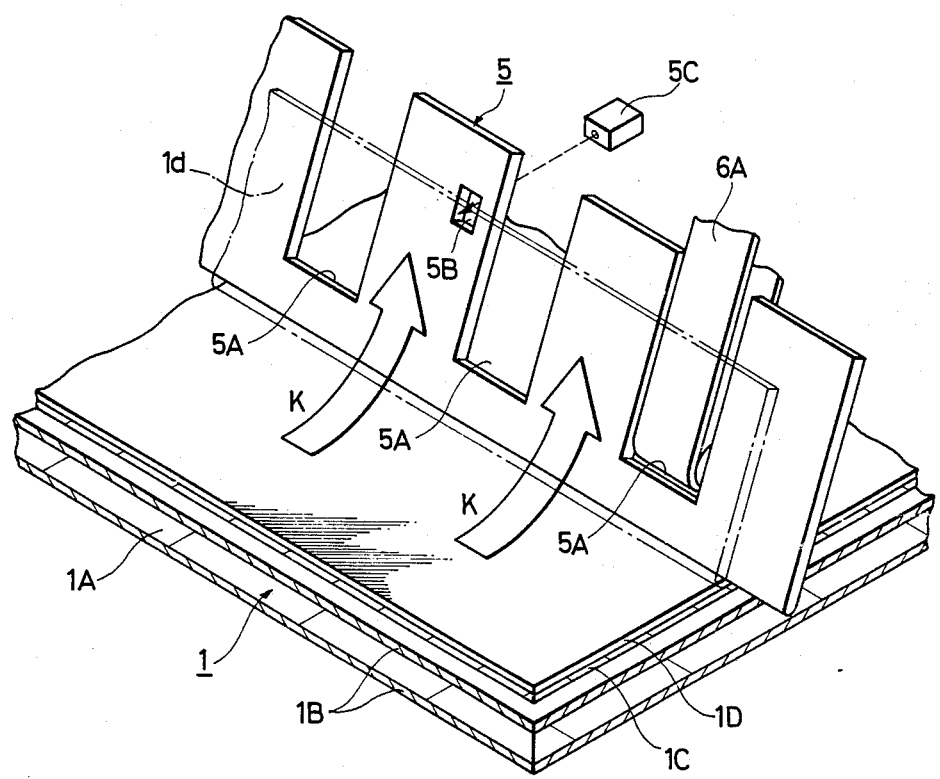
FIG. 17 is a perspective view of the principal part of the peel angle setting plate of FIG. 16.

As shown in FIGS. 16 and 17, the film peeling apparatus of the present invention may be constructed such that the angle $\theta$ of the peeling direction of the peel angle setting plate 5 is obtuse. The peel angle setting plate 5 thus arranged can be set in such a manner that the peel angle at the peel position is obtuse even when the speed of discharging the translucent resin film 1d is substantially equal to that of carrying the board 1. In other words, the peel angle setting plate 5 prevents the deflection of the peel position and peel stress of the translucent resin film 1D and further prevents the photosensitive resin layer 1C from being damaged or broken.

The projection-form detecting member 3A of the film raising mechanism 3 may be wedge-shaped or plate-shaped instead of projection-shape according to the above embodiment.

The present invention is also applicable to a film peeling apparatus for peeling off the end of the laminate raised by the projection-formed detecting member 3A of the film raising device 3, by means of an adhesive tape in place of the fluid injection device 4.

In the present invention, moreover, the peel angle setting plate 5 may be constructed such that its peel angle in the peel direction is variable within the range of right to obtuse angle. In that case, for example, an air cylinder, a hydraulic cylinder or the like is used to make the angle variable.

The present invention is further applicable to a peeling apparatus for peeling off a protective film stuck to a decorative laminated building material.

Although the invention is described in its preferred form with a certain degree of particularity, it is believed obvious that various changes and modifications may be made in the invention without departing from the spirit and scope thereof.

As set forth above, the following effect is achievable in the present invention:

The film peeling apparatus for peeling off the film stuck onto the base by raising one end thereof, comprises the projection-form detecting member for detecting the end of the film stuck onto the base and the oscillating device for raising the end of the film by oscillating the projected-form detecting member upon the detection of the detecting member, to ensure that the end of the film is raised instantly by making the projected-form detecting member detect the end of the film and causing the oscillating device operating on the detection signal to oscillate the projected-form detecting member located at the end of the film.

In addition to the aforesaid construction, there is provided the fluid injection device for peeling the film off the base by injecting a jet of fluid to the end of the film thus raised by the projected-form detecting member to assure that the jet of fluid is sent to the end of the thus certainly raised film and that the film is peeled off efficiently.

What is claimed is:

1. A film peeling apparatus for peeling off a film stuck onto a base by raising one end thereof, comprising a projection-formed detecting member for detecting the end of said film stuck onto said base and an oscillating device for oscillating said projection-formed detecting member upon detection of the end of the film by the detecting member to thereby raise the end of said film.

2. A film peeling apparatus for peeling off a film stuck onto a base, said film peeling apparatus comprising a projection-formed detecting member for detecting the end of said film stuck onto said base, an oscillating device for oscillating said projected detecting member upon detection of the end of the film by said detecting member to thereby raise the end of said film, and a fluid injection device for peeling said film off from said base by injecting a jet of fluid to the end of said film thus raised by said detecting device.

3. A film peeling apparatus of claim 2, wherein said fluid injection device comprises a nozzle member for injecting fluid and wherein said projection-formed detecting member oscillates inside said nozzle member.

4. A film end raising device, applicable to a film peeling apparatus, for raising one end of a film stuck onto a base, comprising a projection-formed detecting member for detecting the end of said film stuck onto the base and an oscillating device for oscillating said projection-formed detecting member upon detection of the end of the film by said detecting member to thereby raise the end of said film from the base.

* * * * *

UNITED STATES PATENT AND TRADEMARK OFFICE
CERTIFICATE OF CORRECTION

PATENT NO. : 4,770,737
DATED : September 13, 1988
INVENTOR(S) : Mitsuhiro Seki

It is certified that error appears in the above-identified patent and that said Letters Patent is hereby corrected as shown below:

ON THE TITLE PAGE:
In the foreign application priority data, please insert:

--July 31, 1986 [JP]   Japan    61-181126--.

Signed and Sealed this

Twelfth Day of January, 1993

Attest:

DOUGLAS B. COMER

Attesting Officer

Acting Commissioner of Patents and Trademarks